(12) United States Patent
Lou

(10) Patent No.: US 6,171,928 B1
(45) Date of Patent: Jan. 9, 2001

(54) METHOD OF FABRICATING SHALLOW TRENCH INSOLATION

(75) Inventor: Chine-Gie Lou, Hsinchu Hsien (TW)

(73) Assignee: Worldwide Semiconductor Manufacturing Corp., Hsinchu (TW)

( * ) Notice: Under 35 U.S.C. 154(b), the term of this patent shall be extended for 0 days.

(21) Appl. No.: 09/395,428

(22) Filed: Sep. 14, 1999

(30) Foreign Application Priority Data

Aug. 13, 1999 (TW) .................................................. 88113866

(51) Int. Cl.$^7$ ..................................................... H01L 21/76
(52) U.S. Cl. .......................... 438/424; 438/296; 438/436; 438/626; 438/692; 438/693
(58) Field of Search ................................. 438/424, 626, 438/692, 693, 436, 296

(56) References Cited

U.S. PATENT DOCUMENTS

| | | | |
|---|---|---|---|
| 5,246,884 | * | 9/1993 | Jaso et al. ............................. 438/693 |
| 5,872,043 | * | 2/1999 | Chen .................................... 438/424 |
| 5,932,487 | * | 8/1999 | Lou et al. ............................. 438/692 |
| 5,950,090 | * | 9/1999 | Chen et al. ........................... 438/296 |
| 6,008,108 | * | 12/1999 | Huang et al. ........................ 438/436 |

FOREIGN PATENT DOCUMENTS 98-119433 * 11/1997 (TW) .

* cited by examiner

*Primary Examiner*—Mahshid Saadat
*Assistant Examiner*—José R. Díaz
(74) *Attorney, Agent, or Firm*—J. C. Patents; Jiawei Huang

(57) ABSTRACT

A method of fabricating a shallow trench isolation (STI). The method forms a spin-on glass layer after removing a pad oxide layer in a STI process in order to fill a cavity formed in an oxide layer in the vicinity of an interface between a STI and a substrate. Then, a planarization process is performed, and the spin-on glass layer is annealed into an oxide layer with good thermal stability.

18 Claims, 3 Drawing Sheets

METHOD OF FABRICATING SHALLOW TRENCH INSOLATION

CROSS-REFERENCE TO RELATED APPLICATION

This application claims the priority benefit of Taiwan application serial no. 88113866, filed Aug. 13, 1999, the full disclosure of which is incorporated herein by reference.

BACKGROUND OF THE INVENTION

1. Field of Invention

The present invention relates to a method of fabricating isolation for an integrated circuit (IC) device. More particularly, the present invention relates to a method of fabricating shallow trench isolation (STI).

2. Description of Related Art

A complete circuit such as an integrated circuit (IC) is usually composed of thousands of MOS transistors. To prevent a short circuit between these adjacent transistors, an isolation structure for electrical isolation between adjacent transistors must be added.

Field oxide (FOX), manufactured by local oxidation silicon (LOCOS), is used conventionally as an isolation structure in the semiconductor process. However, there are still many issues within the LOCOS technique, including conventional problems related to the stress mechanism, the formation of a bird's beak around a LOCOS field isolation structure, etc. The problem resulting from the bird's beak, in particular, has made the LOCOS field isolation structure ineffective for isolation in small devices.

To accommodate the tendency towards shrinkage of the critical dimension (CD) of devices, shallow trench isolation, effective for isolation in small devices, has become the preferred isolation technique for the deep sub-micron process.

FIGS. 1A through 1C are schematic, cross-sectional views showing the progression of manufacturing steps in fabricating a conventional shallow trench isolation.

First, as shown in FIG. 1A, a substrate 100 is provided. A pad oxide layer 102 and a mask layer 104 are sequentially formed thereon. Next, a photolithographic and etching operation is conducted to form a shallow trench 106 that extends into the substrate 100. The pad oxide layer 102 can be formed using a thermal oxidation method and the mask layer 104 can be formed using a chemical vapor deposition (CVD) method.

A liner oxide layer 108 is then formed on the exposed surface of the substrate 100 in the shallow trench 106. The liner oxide layer 108 can be formed using a thermal oxidation method Referring to FIG. 1B, an oxide layer 110 is formed on the substrate 100 to fill the shallow trench 106. The oxide layer 110 can be formed by first forming an oxide layer (not shown in the figure) over the mask layer 104 and filling the shallow trench 106. Next, a chemical mechanical polishing (CMP) process is introduced to remove the oxide layer above the mask layer 104.

The oxide layer 110 is formed by, for example, chemical vapor deposition with a gas source of ozone ($O_3$) and tetra-ethyl-ortho-silicate (TEOS), or by high density plasma chemical vapor deposition (HDPCVD).

Referring to FIG. 1C, the pad oxide layer 102 and the mask layer 104 are removed by wet etching, and a STI is completed.

However, since different methods are used to form the pad oxide layer 102 and the oxide layer 110, respectively, the pad oxide layer 102 and the oxide layer 110 have different densities.

In general, the pad oxide layer 102 formed by thermal oxidation has a better etching resistance than the oxide layer 110 formed by chemical vapor deposition. That is, the etching rate for the pad oxide layer 102 is lower than that for the oxide layer 110 in the same etching process. Thus, in the prior art, when the pad oxide layer 102 and the oxide layer 110 are removed in an etching process, the oxide layer 110 in the STI 106 is more easily etched than the pad oxide layer 102 does. Thus, a cavity 112 is formed on the surface of the oxide layer 110 in the vicinity of the interface between the STI 106 and the substrate 100.

Due to the cavity 112 in the oxide layer 110 that fills the STI 106, a kink effect is induced during the operation of the device. Thus, the isolation of the STI may malfunction because of a significant subthreshold current, and the yield could be reduced.

SUMMARY OF THE INVENTION

The invention provides a fabrication of a shallow trench isolation to prevent an oxide layer in the vicinity of the interface between a substrate and a STI from forming a cavity while a pad oxide layer is removed, to prevent a kink effect from being induced during the operation of a device, and further to prevent a reduction in yield.

According to the invention, the fabrication comprises providing a substrate, on which a pad oxide layer and a mask layer are formed. The pad oxide layer is formed by thermal oxidation. Photolithography and etching operation are next performed to form an STI in the substrate. A liner oxide layer is then formed on the substrate around the STI and an oxide layer is formed by chemical vapor deposition to cover the mask layer and to fill the STI. Portions of the oxide layer on the surface of the mask layer and remaining portions of the oxide layer in the STI are removed, followed by removal of the mask layer and the pad oxide layer and resulting in a cavity in the oxide layer in the vicinity of an interface between the STI and the substrate. A spin-on glass layer is formed on the resulting structure to fill the cavity, and is planarized to expose the substrate and the spin-on glass layer remaining in the cavity. The spin-on glass layer in the cavity is annealed and becomes an oxide layer.

The invention forms a spin-on glass layer after removing a pad oxide layer in a STI process in order to fill a cavity formed in an oxide layer in the vicinity of an interface between a STI and a substrate, performs a planarization process, and anneals the spin-on glass layer into an oxide layer with good thermal stability.

The invention provides a spin-on glass layer with a good capability for filling a cavity to reduce a kink effect resulting from the cavity. Thus, the phenomenon of increasing a subthreshold current is minimized during the operation of a device, and a yield is enhanced.

The invention provides a slurry with a higher polishing rate of a spin-on glass layer with respect to an oxide layer formed by chemical vapor deposition for planarizing the spin-on glass layer in a chemical mechanical polishing process. As a result, dishing is minimized on the surface of the oxide layer in the STI structure, and the process window is enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIG. 2A through FIG. 2F are schematic, cross-sectional views showing a process for fabricating a STI according to a preferred embodiment of the invention.

Figure 1A:
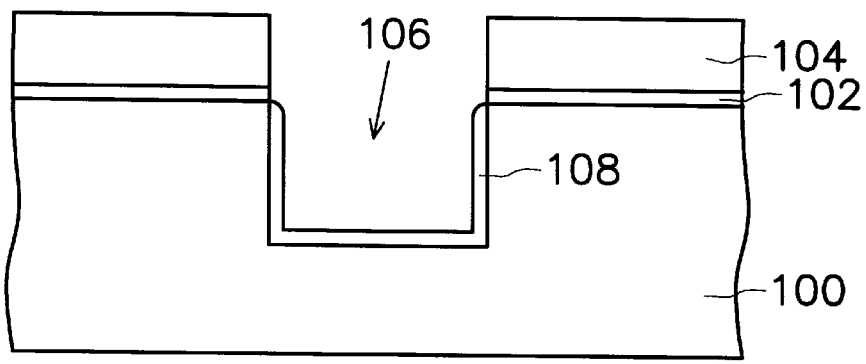
FIG. 1A is a schematic, cross-sectional view showing a process for fabricating a trench in a substrate.
Figure 1B:
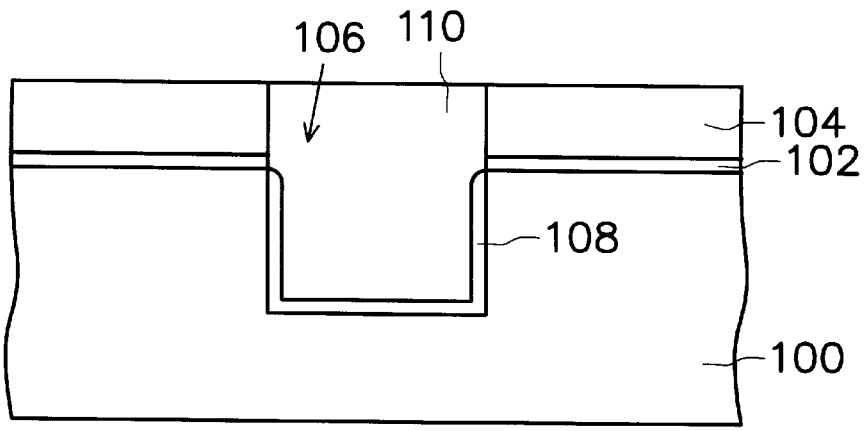
FIG. 1B is a schematic, cross-sectional view showing the step of filling the shallow trench as shown in FIG. 1A.
Figure 1C:
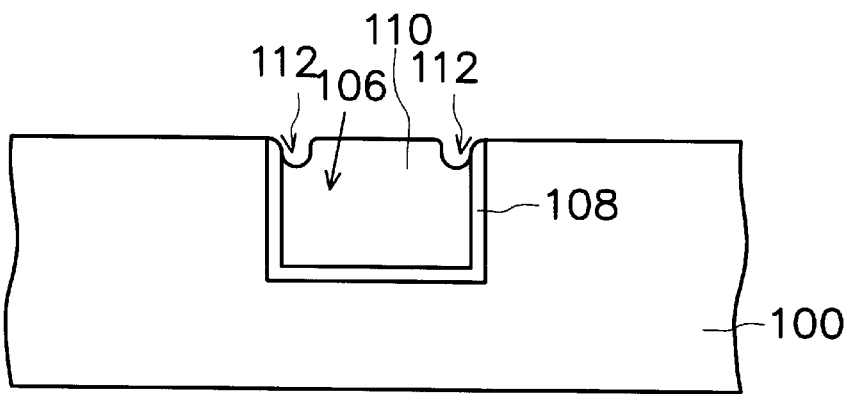
FIG. 1C is a schematic, cross-sectional view showing the step for forming the shallow trench isolation according to the prior art.
Figure 2A:
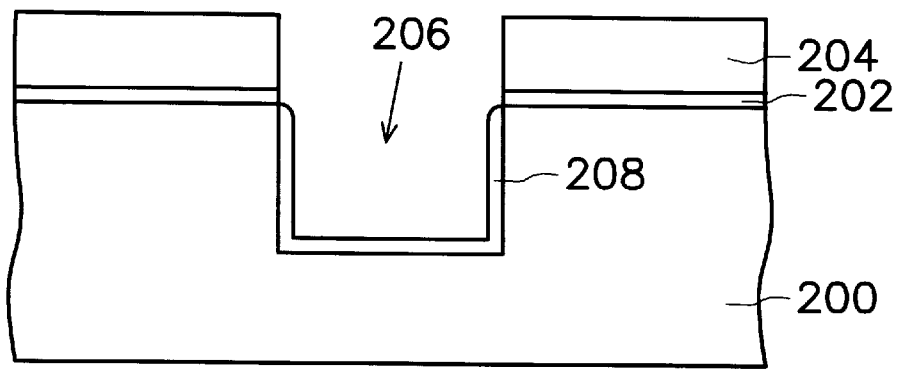
FIG. 2A is a schematic, cross-sectional view showing a step of forming a trench in a substrate according to the invention.

As shown in FIG. 2A, a substrate 200 is provided, wherein a pad oxide layer 202 and a mask layer 204 are sequentially formed thereon. A photolithographic and etching operation is conducted to form a shallow trench 206 extending into the substrate 200.

The pad oxide layer 202 can be formed to a thickness of about 100–300 Å using, for example, a thermal oxidation method, and the mask layer 204 can be formed to a thickness of about 1500–2000 Å using, for example, a chemical vapor deposition (CVD) method. The shallow trench 206 formed by the photolithographic and etching operation has a depth of about 3000–5000 Å.

A liner oxide layer 208 is formed on the exposed surface of the substrate 200 in the shallow trench 206. The liner oxide layer 208 can be formed to a thickness of about 100–250 Å using, for example, a thermal oxidation method.

Figure 2B:
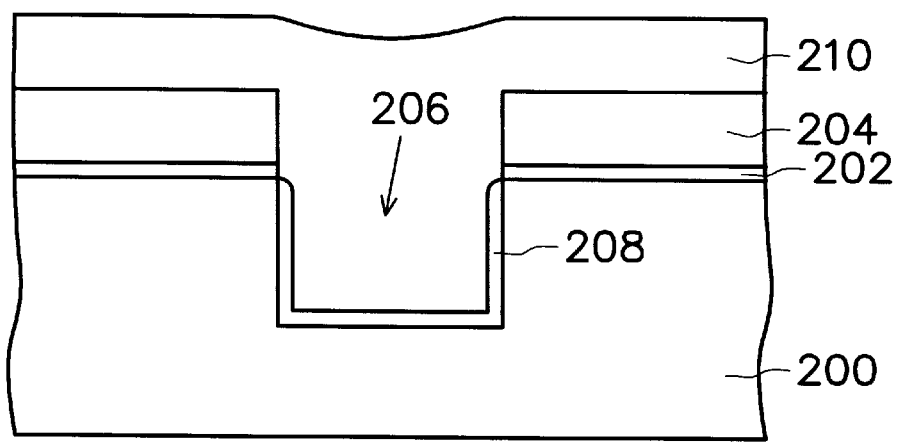
FIG. 2B is a schematic, cross-sectional view showing a step of filling the trench as shown in FIG. 2A.

Referring to FIG. 2B, an oxide layer 210 is formed to cover the mask layer 204, and the oxide layer 210 fills the shallow trench 206. The oxide layer 210 is formed to a thickness of about 8000–11000 Å by, for example, chemical vapor deposition.

Figure 2C:
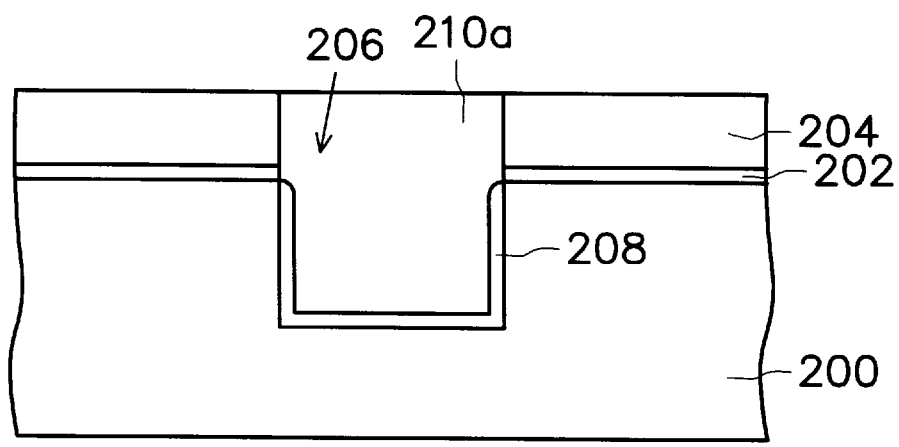
FIG. 2C is a schematic, cross-sectional view showing a step removing the excessive oxide layer filling the trench.

Referring to FIG. 2C, portions of the oxide layer 210 covering the surface of the mask layer 204 are removed by, for example, chemical mechanical polishing, and portions 210a of the oxide layer 210 in the shallow trench 206 remain.

Figure 2D:
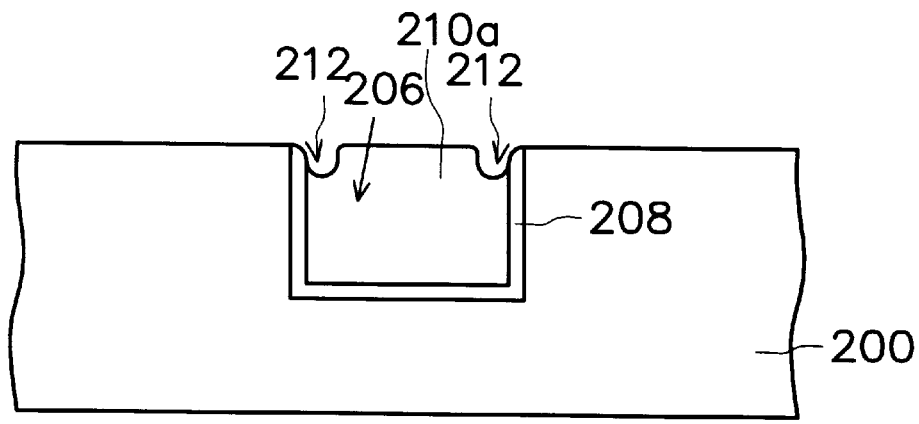
FIG. 2D is a schematic, cross-sectional view showing a step of planarization to remain the oxide layer in the trench only.

Referring to FIG. 2D, the mask layer 204 and the pad oxide layer 202 are removed by wet etching. Since different methods are used to form the pad oxide layer 202 and the oxide layer 210a in the shallow trench 206, the pad oxide layer 202 has a better etching resistance than the oxide layer 210a in the shallow trench 206; that is, the pad oxide layer 202 has a lower etching rate with respect to the oxide layer 210a. Thus, in the process of removing the pad oxide layer 202, the surface of the oxide layer 210a in the interface between the shallow trench 206 and the substrate 200 has a higher etching rate, resulting in a cavity 212.

Figure 2E:
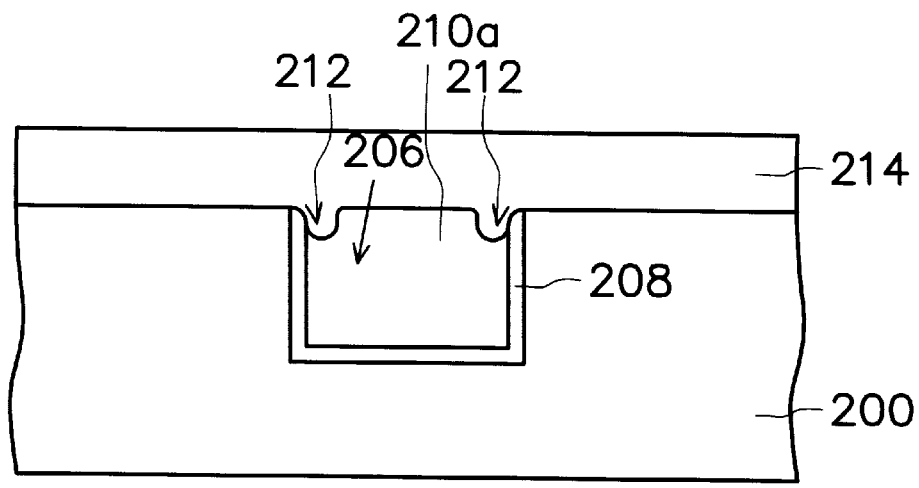
FIG. 2E is a schematic, cross-sectional view showing a step of forming a spin-on-glass layer.

Referring to FIG. 2E, a spin-on glass layer 214 is formed to cover the oxide layer 210a and the substrate 200. Since the spin-on glass layer 214 has a good capability for filling the cavity 212, the cavity 212 can be filled and local planarization is also achieved.

Figure 2F:
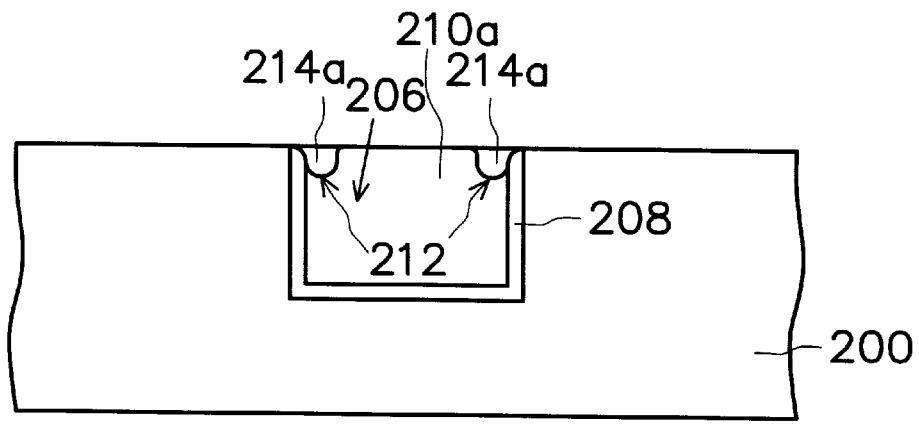
FIG. 2F is a schematic, cross-sectional view showing a step of forming the shallow trench isolation free of cavity thereon according to the invention.

Referring to FIG. 2F, a chemical mechanical polishing is performed while using the substrate 200 as a stop layer to remove the spin-on glass layer on the substrate 200. The spin-on glass layer 214a in the cavity 212 remains so as to eliminate the cavity 212 that would induce a kink effect.

The slurry used in the chemical mechanical polishing has, for example, a higher polishing rate for the spin-on glass layer 214 with respect to the oxide layer 210a formed by chemical vapor deposition to minimize dishing on the oxide layer 210a.

However, in order to enhance the thermal stability of the spin-on glass layer 214a in the cavity 212, the spin-on glass layer 214a in the cavity 212 is annealed into an oxide with a good thermal stability. The operation temperature of the annealing is about 900–1100° C. in a $N_2$ environment.

The invention forms a spin-on glass layer after removing a pad oxide layer in a STI process in order to fill a cavity formed in an oxide layer in the vicinity of an interface between a STI and a substrate, performs a planarization process, and anneals the spin-on glass layer into an oxide layer with good thermal stability.

The invention provides a spin-on glass layer with a good capability for filling a cavity to reduce a kink effect resulting from the cavity. Thus, the phenomenon of increasing a subthreshold current is minimized during the operation of a device, and yield is enhanced.

The invention provides a slurry with a higher polishing rate for a spin-on glass layer with respect to an oxide layer formed by chemical vapor deposition for planarizing the spin-on glass layer in a chemical mechanical polishing process; thus, dishing is minimized on the surface of the oxide layer in the STI structure, and the process window is enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation (STI), comprising:

providing a substrate;

forming a pad oxide layer to cover the substrate;

forming a mask layer to cover the pad oxide layer;

forming a shallow trench in the substrate;

forming a liner oxide layer on a surface of the shallow trench;

forming an oxide layer to cover the mask layer and to fill the shallow trench;

removing portions of the oxide layer with a surface level higher than the mask layer;

removing the mask layer and the pad oxide layer, resulting in a cavity in the oxide layer in a vicinity of an interface between the shallow trench and the substrate;

filling the cavity with a first spin-on glass layer; and annealing the first spin-on glass layer in the cavity.

2. The method of fabricating a shallow trench isolation of claim 1, wherein the method used to form the pad oxide layer comprises a thermal oxidation.

3. The method of fabricating a shallow trench isolation of claim 1, wherein the oxide layer is formed by chemical vapor deposition.

4. The method of fabricating a shallow trench isolation of claim 1, wherein the portions of the oxide layer on the mask layer are removed by chemical mechanical polishing.

5. The method of fabricating a shallow trench isolation of claim 1, wherein the cavity is filled with the first spin-on glass layer in steps comprising:

forming a second spin-on glass layer to cover the substrate; and performing a planarization process to expose the substrate while leaving the first spin-on glass layer in the cavity.

6. The method of fabricating a shallow trench isolation of claim 5, wherein the planarization process comprises chemical mechanical polishing.

7. The method of fabricating a shallow trench isolation of claim 6, wherein a slurry used in the chemical mechanical polishing comprises a slurry with a higher polishing rate for the second spin-on glass layer with respect to the oxide layer.

8. The method of fabricating a shallow trench isolation of claim 1, wherein an operation temperature of the annealing is about 900–1100° C. in a $N_2$ environment.

9. A method of fabricating a shallow trench isolation (STI), comprising:

providing a substrate;

forming a pad oxide layer to cover the substrate by thermal oxidation;

forming a shallow trench in the substrate;

forming an oxide layer to fill the shallow trench by chemical vapor deposition;

removing the mask layer and the pad oxide layer using chemical-mechanical polishing;

forming a spin-on glass on the resulting structure after removing the pad oxide layer;

performing a planarization process on the spin-on glass layer to expose the substrate; and annealing the remaining spin-on glass layer.

10. The method of fabricating a shallow trench isolation of claim 9, wherein the planarization process comprises chemical mechanical polishing.

11. The method of fabricating a shallow trench isolation of claim 10, wherein a slurry used in the chemical mechanical polishing comprises a slurry with a higher polishing rate for the spin-on glass layer with respect to the oxide layer.

12. The method of fabricating a shallow trench isolation of claim 9, wherein an operation temperature of the annealing is about 900–1100° C. in a $N_2$ environment.

13. The method of claim 9, wherein a removal rate for planarizing the spin-on glass is faster than a polishing rate for polishing the oxide layer formed by shallow trench isolation.

14. A method of fabricating a shallow trench isolation, comprising the steps of:

providing a substrate;

forming a pad oxide layer on the substrate;

patterning the pad oxide layer and the substrate to form a trench in the substrate;

filling the trench with an oxide layer which overflows over the pad oxide, wherein the oxide layer has a faster removal speed than the pad oxide for chemical-mechanical polish;

performing a first chemical-mechanical polishing step until the substrate is exposed, so that the trench is filled with an oxide plug level with the substrate;

forming a spin-on-glass on the substrate and the oxide plug after performing the step of first chemical-mechanical polishing; and performing a planarization step on the spin-on-glass layer to expose the substrate.

15. The method of claim 14, wherein the first chemical-mechanical polishing step comprises performing chemical-mechanical polishing using a slurry with a faster removal rate of the oxide layer compared to the pad oxide layer.

16. The method of claim 14, wherein the planarization step comprises a second step of chemical-mechanical polishing.

17. The method of claim 16, wherein the second step of chemical polishing is performed using a slurry with a faster removal rate compared to the oxide plug.

18. The method of claim 16, wherein the second chemical-mechanical polishing step is performed with a polishing rate than the first chemical-mechanical polishing step.

* * * * *